(12) United States Patent
Lopez et al.

(10) Patent No.: US 9,149,882 B1
(45) Date of Patent: Oct. 6, 2015

(54) THERMAL CARRIER

(71) Applicant: Flextronics AP, LLC, Broomfield, CO (US)

(72) Inventors: Omar Garcia Lopez, Jalisco (MX);
Enrique Avelar Secada, Jalisco (MX);
Dason Cheung, Fremont, CA (US);
Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/565,295

(22) Filed: Dec. 9, 2014

(51) Int. Cl.
| | |
|---|---|
| B23K 31/02 | (2006.01) |
| B23K 37/00 | (2006.01) |
| B23K 1/20 | (2006.01) |
| B23K 1/00 | (2006.01) |
| B23K 3/04 | (2006.01) |
| B23K 3/06 | (2006.01) |
| H05K 3/34 | (2006.01) |
| B23K 1/08 | (2006.01) |

(52) U.S. Cl.
CPC ............... B23K 1/20 (2013.01); B23K 1/0008 (2013.01); B23K 1/0016 (2013.01); B23K 1/085 (2013.01); B23K 3/04 (2013.01); B23K 3/0653 (2013.01); H05K 3/3468 (2013.01)

(58) Field of Classification Search
None
See application file for complete search history.

(56) References Cited

U.S. PATENT DOCUMENTS

| | | | |
|---|---|---|---|
| 3,652,075 A * | 3/1972 | Thompson | 269/21 |
| 5,203,489 A * | 4/1993 | Gileta et al. | 228/219 |
| 5,240,169 A * | 8/1993 | Gileta | 228/180.1 |
| 5,292,055 A * | 3/1994 | Gileta | 228/180.1 |
| 5,617,990 A * | 4/1997 | Thompson, Sr. | 228/180.1 |
| 6,142,357 A * | 11/2000 | Howell | 228/39 |
| 6,145,729 A * | 11/2000 | Thompson, Sr. | 228/39 |
| 6,164,633 A * | 12/2000 | Mulligan et al. | 269/21 |
| 6,223,973 B1 * | 5/2001 | Wong et al. | 228/180.1 |
| 6,866,182 B2 * | 3/2005 | Wong et al. | 228/219 |
| 7,182,793 B2 * | 2/2007 | Duan et al. | 29/25.01 |
| 7,614,538 B2 * | 11/2009 | Gillotti et al. | 228/4.5 |
| 7,975,899 B2 * | 7/2011 | Jindo et al. | 228/42 |
| 8,752,751 B2 * | 6/2014 | Chuang et al. | 228/4.5 |
| 2005/0006435 A1 * | 1/2005 | Diehm et al. | 228/37 |
| 2005/0067463 A1 * | 3/2005 | Wang et al. | 228/37 |
| 2005/0284656 A1 * | 12/2005 | Shimada et al. | 174/255 |
| 2006/0102703 A1 * | 5/2006 | Akhtar et al. | 228/260 |
| 2006/0226201 A1 * | 10/2006 | Reed | 228/101 |
| 2008/0142568 A1 * | 6/2008 | Reed | 228/44.7 |
| 2009/0020593 A1 * | 1/2009 | Kinoshita et al. | 228/232 |
| 2009/0183190 A1 * | 7/2009 | Fukuda et al. | 720/695 |
| 2010/0078413 A1 * | 4/2010 | Hosokawa et al. | 219/121.64 |
| 2011/0031297 A1 * | 2/2011 | Nakaya et al. | 228/102 |
| 2013/0020379 A1 * | 1/2013 | Kim | 228/256 |

* cited by examiner

Primary Examiner — Kiley Stoner
(74) Attorney, Agent, or Firm — Haverstock & Owens LLP (57) ABSTRACT

A method and system for a preheating step of a wave soldering process. A bottom side preheater is positioned underneath a PCB and a thermal carrier is positioned adjacent the PCB. A top side heater may also be used. The PCB includes one or more through holes, and an electronic component having one or more pins is mounted on the PCB so that each pin is positioned in a corresponding through hole. The bottom side preheater directs heat to the bottom surface of the PCB, thereby heating the bottom surface via heat convection. The thermal carrier directs heated air laterally across the top surface of the PCB to increase a heat transfer at the top surface without increasing the temperature of the electronic component, thereby reducing a temperature differential between the top and bottom surfaces.

7 Claims, 6 Drawing Sheets

THERMAL CARRIER

FIELD OF THE INVENTION

The present invention is generally directed to the field of printed circuit board assemblies. More specifically, the present invention is directed to a printed circuit board assemblies and to methods of assembling a component onto a printed circuit board.

BACKGROUND OF THE INVENTION

Printed circuit boards (PCBs) are typically made of multiple layers of insulated and conductive materials. Electronic components are mounted to the PCB to form a printed circuit board assembly (PCBA). To mount an electronic component to the PCB, an electronic component includes components leads, or pins, which are inserted into through-holes in the PCB. The pins are then mechanically and electrically connected to the PCB, such as by a filling the through holes with solder.

Figure 1:
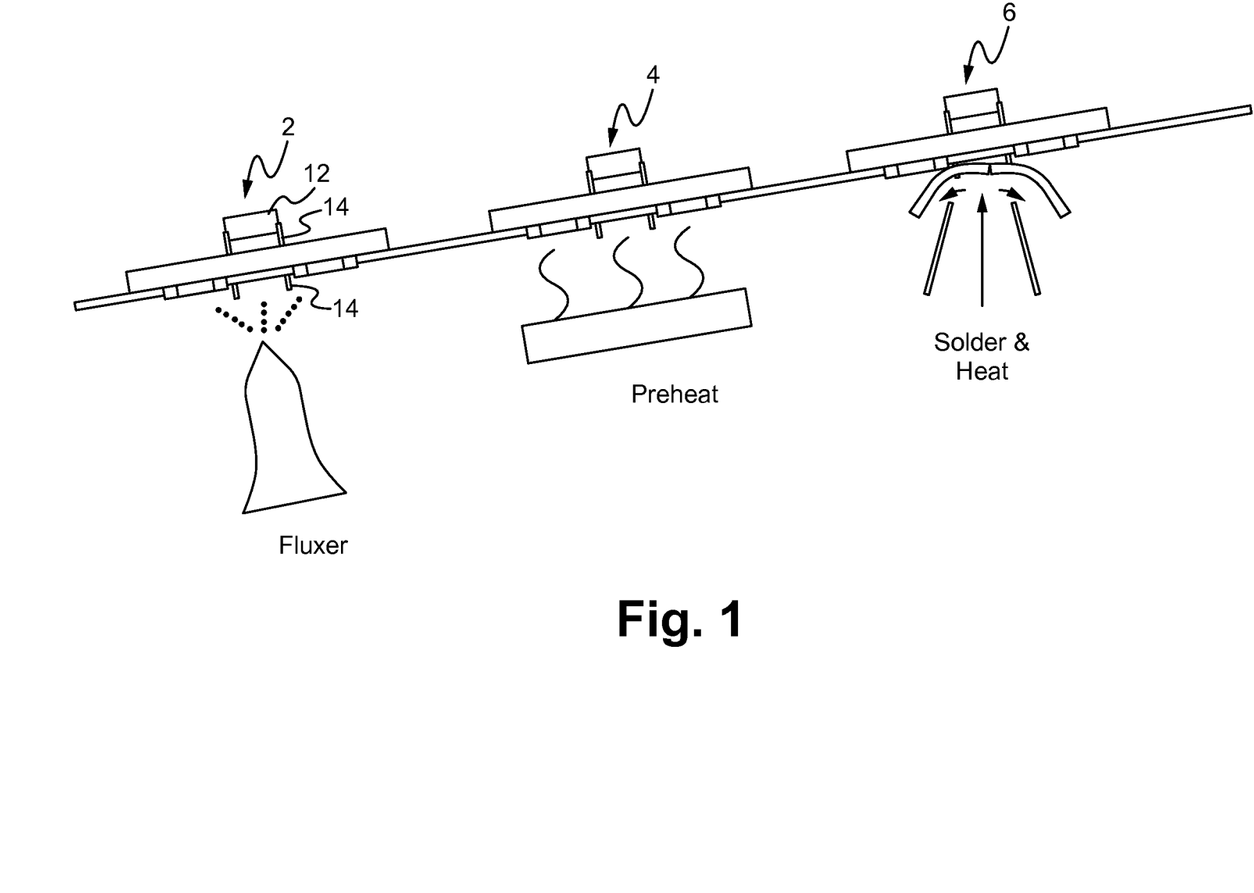
FIG. 1 illustrates a conventional wave soldering process.

A conventional method of filling the through holes is a wave soldering process. FIG. 1 illustrates a conventional wave soldering process. The wave soldering process is applied to a PCB 12 that includes an electronic component 12 with pins 14. The electronic component 12 is mounted on a top surface of the PCB such that the pins 14 are positioned in through holes (not shown) in the PCB 10. At the step 2, flux is applied to a bottom surface of the PCB 10. At the step 4, heat is applied to the bottom surface of the PCB 10 to activate the flux and to prevent or minimize thermal shock when solder is subsequently applied. A convection heater is positioned underneath the PCB 10. This is known as a preheating step. At the step 6, solder is applied. Molten solder is contained in a tank called a solder pot. The molten solder is agitated to have a pattern of waves on its surface. When the PCB 10 is moved over this tank, the solder waves contact the bottom surface of the PCB, and stick to the solder pads and pins via surface tension.

Figure 2A:
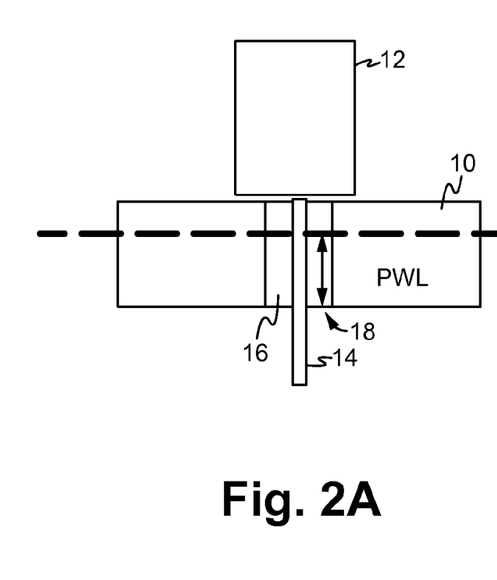
FIGS. 2A-2C illustrate an example of the impact on barrel fill with increasing PCB thickness.
Figure 2B:
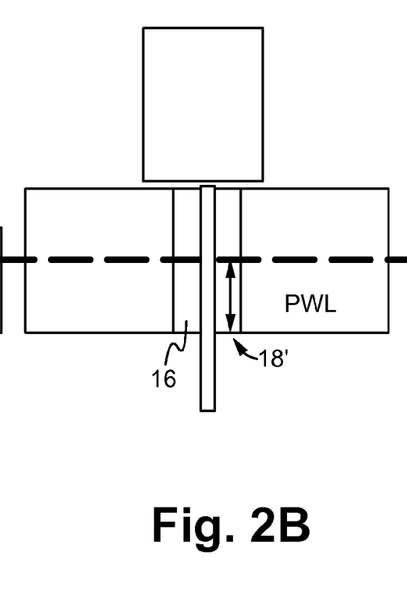
Figure 2C:
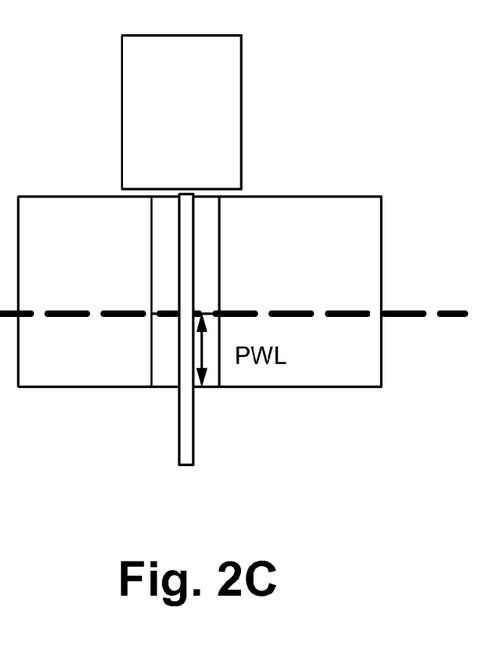

Barrel fill is a measure of how much the through hole is filled with solder. The ideal goal is 100% barrel fill, where the entire through hole is filled with solder. In practice however, the percentage of barrel fill is limited by the solder fluidity as the solder begins to cool immediately upon contact with the bottom surface of the PCB. Additionally, barrel fill issues are becoming more problematic due to new PCB designs that have more and more layers leading to thicker and thicker PCBs. FIGS. 2A-2C illustrate an example of the impact on barrel fill with increasing PCB thickness. FIG. 2A shows the PCB 10 having a first thickness. In this example, the flow of solder 16 into the through hole 18 reaches the dashed line, which corresponds to a barrel fill of approximately 75%. If the PCB thickness is increased, as in FIG. 2B, under the same conditions the percentage of barrel fill drops since the solder 16 flows into the through hole 18' only to the dashed line. With an even increased PCB thickness, as in FIG. 2C, the percentage of barrel fill drops even further.

Insufficient barrel fill leads to reliability problems. Solder in the through hole provides mechanical support for securing the electronic component to the PCB, as well as provides electrical connectivity between the pin and the conductive layers that are electrically connected at the through hole. The larger the percentage barrel fill, the greater the mechanical stability and electrical connectivity. Further, greater percentage barrel fill results in a larger interface area between the solder and pin. Over time, portions of the solder may crack, and the larger interface area provides more portions that remain in contact which leads to longer usable life of the device.

SUMMARY OF THE INVENTION

Embodiments are directed to a method and system for more uniformly heating a top surface and bottom surface of a printed circuit board (PCB) during a preheating step of a soldering process, such as a wave soldering process. The system includes one or more bottom side preheaters positioned underneath the PCB and a thermal carrier positioned adjacent one or more sides of the PCB. In some embodiments, the system also includes one or more top side heaters positioned on top of the PCB.

In an aspect, a system for performing a preheating step of a wave soldering process is disclosed. The system include a printed circuit board assembly, a bottom side preheater and a thermal carrier. The printed circuit board assembly includes a printed circuit board having a top surface and a bottom surface, one or more through holes and an electronic component having one or more pins, each pin positioned in a corresponding through hole. The bottom side preheater is configured to direct heated air upward toward the bottom surface of the printed circuit board. The thermal carrier includes duct work having one or more downward facing input openings and one or more laterally facing output openings, wherein the thermal carrier is positioned adjacent to the printed circuit board assembly such that heated air from the bottom side preheater is input into the input openings and heated air is output from the output openings laterally across the top surface of the printed circuit board. In some embodiments, the one or more output openings in the duct work are configured to uniformly distribute the heated air across the top surface of the printed circuit board. In other embodiments, the one or more output openings in the duct work are aligned with the electronic component to selectively distribute the heated air across the top surface to the electronic component. In some embodiments, the system also includes a top side preheater configured to output heated air downward toward the top surface of the printed circuit board. In some embodiments, the duct work also includes one or more upward facing input openings positioned to receive heated air from the top side preheater and to output the heated air from the output openings. In some embodiments, the thermal carrier also includes a motorized fan. In some embodiments, the laterally output heated air increases a top surface temperature of the top surface underneath the electronic component, thereby decreasing a temperature differential between the top surface temperature and a bottom surface temperature.

In another aspect, a method of performing a preheating step of a wave soldering process is disclosed. The method includes positioning a printed circuit board assembly above a bottom side preheater, wherein the printed circuit board assembly comprises a printed circuit board having a top surface and a bottom surface, one or more through holes and an electronic component having one or more pins, each pin positioned in a corresponding through hole. The method also includes directing heated air upward from the bottom side preheater toward the bottom surface of the printed circuit board, and directing a portion of the heated air laterally across the top surface of the printed circuit board. In some embodiments, directing the portion of the heated air laterally across the top surface includes uniformly distributing the heated air across the top surface of the printed circuit board. In other embodiments, directing the portion of the heated air laterally across the top surface includes selectively distributing the heated air across the top surface to the electronic component. In some embodiments, positioning the printed circuit board assembly also includes positioning the printed circuit board assembly below a top side preheater, and the method also includes directing heated air downward from the top side preheater toward the top surface of the printed circuit board. In some embodiments, directing the portion of the heated air laterally across the top surface of the printed circuit board includes forcing the air using a fan. In some embodiments, the laterally directed heated air increases a top surface temperature of the top surface underneath the electronic component, thereby decreasing a temperature differential between the top surface temperature and a bottom surface temperature.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a thermal carrier. Those of ordinary skill in the art will realize that the following detailed description of the thermal carrier is illustrative only and is not intended to be in any way limiting. Other embodiments of the thermal carrier will readily suggest themselves to such skilled persons having the benefit of this disclosure.

Reference will now be made in detail to implementations of the thermal carrier as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 3:
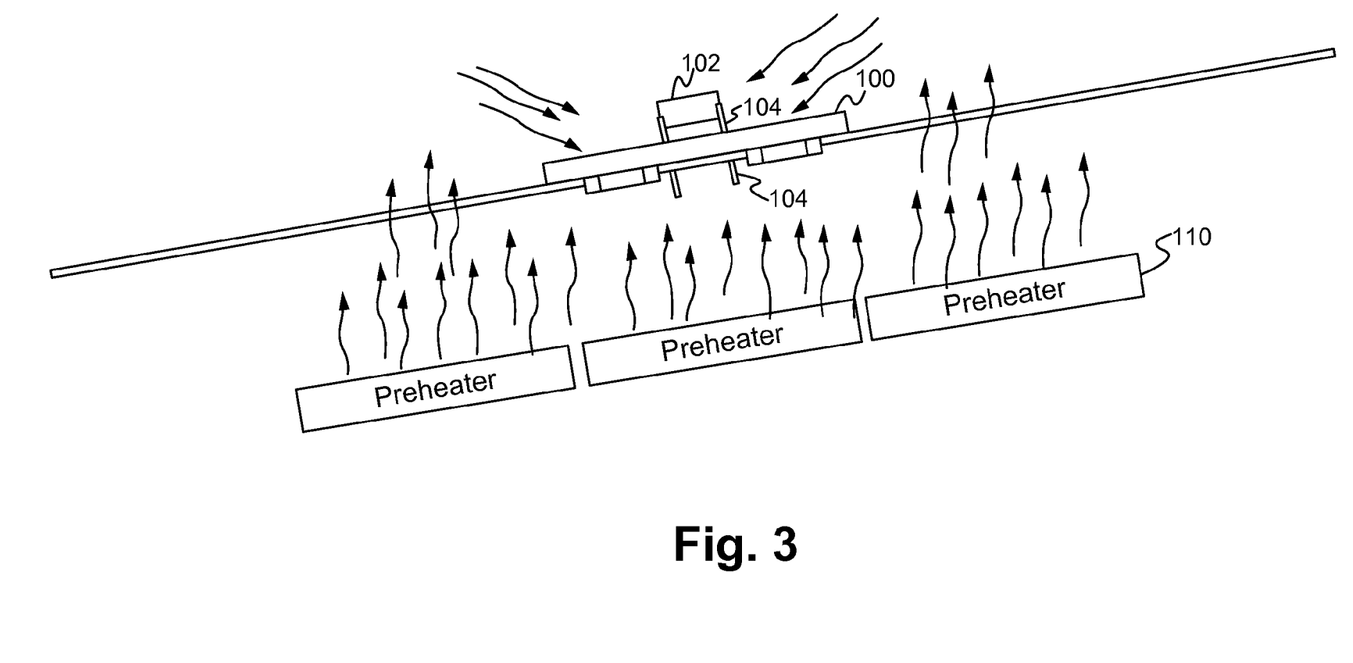
FIG. 3 illustrates an exemplary application of preheaters without a thermal carrier for applying heat to a PCB.

The thermal carrier is configured to direct heated air laterally across the top surface of the PCB. A printed circuit board assembly (PCBA) includes the PCB having the top surface, the bottom surface and one or more through holes, and an electronic component having one or more pins, each pin positioned in a corresponding through hole. During the preheating step of the wave soldering process, the bottom side preheaters direct heat to the bottom surface of the PCB, thereby heating the bottom surface via natural or forced heat convection. FIG. 3 illustrates an exemplary application of preheaters without a thermal carrier for applying heat to a PCB 100. The PCB 100 includes an electronic component 102 with pins 104. The electronic component 102 is mounted on a top surface of the PCB 100 such that the pins 104 are positioned in through holes (not shown) in the PCB 100. One or more bottom side preheaters 110 are positioned underneath the PCB 100. At least a portion of the one or more bottom side preheaters 110 are positioned directly underneath a footprint of the PCB 100, and a remaining portion of the preheaters 110 extends beyond a footprint of the PCB 100.

Heat transfers through the PCB to the top surface via heat conduction. The heated bottom surface has a greater temperature than the top surface, resulting in a temperature differential, referred to as delta T. This is particularly true at the top surface portion proximate the through holes as the electronic component covers these portions of the top surface resulting in relative cold spots. The greater the value of delta T, the less distance D the solder moves into the through hole from the bottom surface where the solder is applied during the wave soldering process. Even in the case of top side preheaters, such as the exemplary configuration shown in FIG. 4 that includes one or more top side preheaters 120 without a thermal carrier, the electronic component blocks the underneath top surface from receiving the same amount of heat provided by the preheaters as compared to the exposed portions of the top surface, still resulting in cold spots. Further, since top side preheaters direct heat directly downward onto the top surface of the PCB, including the electronic component mounted on the top surface, the amount of heat provided by top side preheaters is limited so as not to damage the electronic component.

Figure 5:
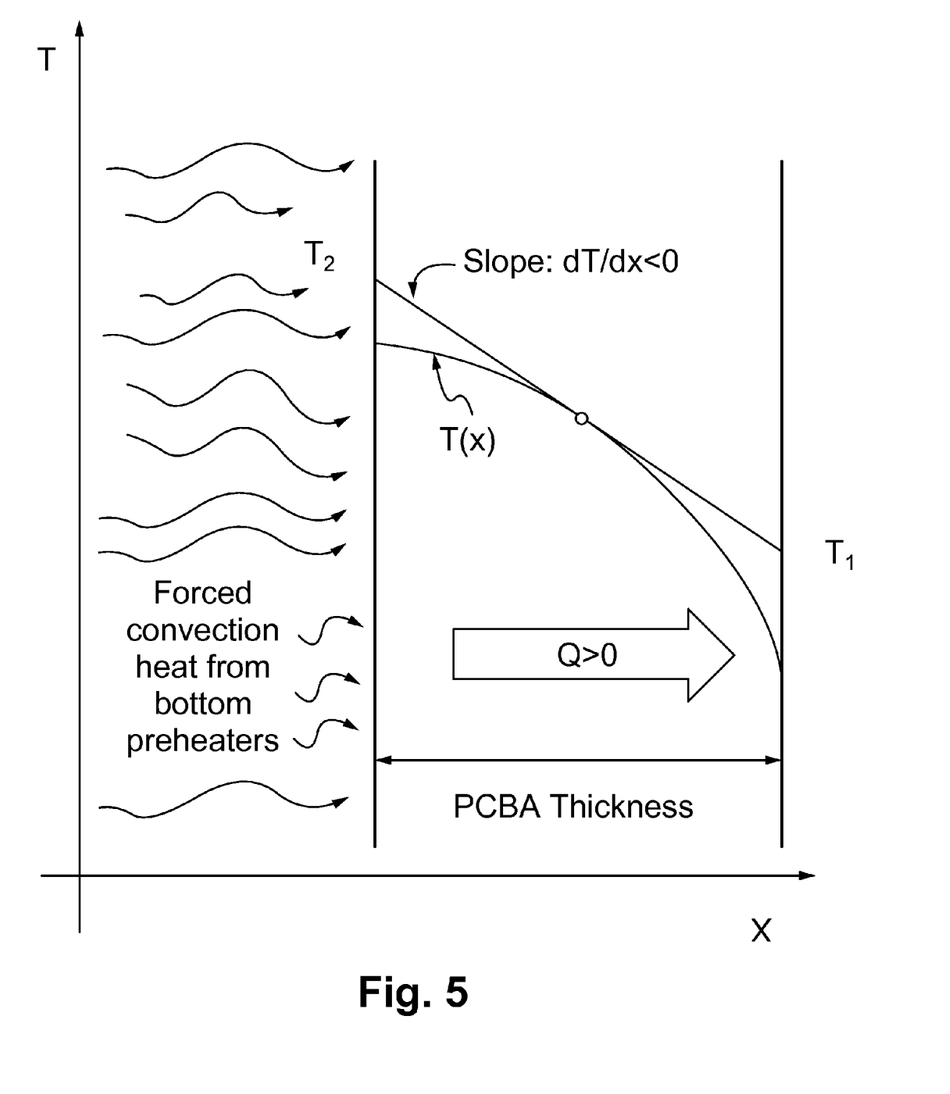
FIG. 5 illustrates the heat transfer concepts applied to the printed circuit board.

FIG. 5 illustrates the heat transfer concepts applied to the printed circuit board. The bottom surface of the PCB is heated using natural or forced heat convection supplied by bottom side preheaters, resulting in a bottom surface temperature T2. Heat transfers from the bottom surface of the PCB to the top surface via heat conduction. The amount of heat conduction Q transferred is determined according to Fourier's law of heat conduction where $Q=-kA(dT/dx)$, where dT is the delta T between the bottom surface temperature T2 and the top surface temperature T1, dx is the PCB thickness, A is the surface area of the bottom surface of the PCB to which heat is applied, and k is the thermal coefficient of the PCB. This exemplary calculation provides a measure of one-dimensional heat conduction and it is assumed that the PCB is an isotropic material. It is understood that more complex calculations can be performed as are well known in the art of heat transfer. The bottom surface temperature T2 is limited to a maximum temperature T2max. Temperatures greater than the maximum temperature T2max will burn the flux applied to the bottom surface. Higher temperatures may also damage the PCB itself. The type of flux typically drives the bottom side temperature T2.

In an exemplary application, the bottom surface of the PCB is heated to a bottom surface temperature T2 of about 150 C, and molten solder is heated to a temperature of about 285 C, referred to as temperature T3. The solder temperature T3 is limited to a maximum temperature T3max. Higher than the T3max will dissolve the conductive materials on the bottom surface and lining of the through holes, such as copper. As soon as the molter solder contacts the bottom surface of the PCB, the molten solder is subject to a change in temperature of delta T23. In this example delta T23=135 C. Such a drastic change in temperature results in significant thermal shock. A problem with such a large delta T23 is that the temperature of the solder quickly drops below its liquidus temperature, such as 217 C for solder material SAC 305, which initiates solidification of the solder. With an added decrease in temperature between the bottom surface and the top surface of the PCB, delta T12, the solidification process of the solder in the through hole is further enhanced. The greater the value of delta T12, the faster the solder solidifies and the less distance D the solder moves into the through hole. The lower the value of delta T12, the greater the distance D the solder can move into the through hole. The distance D is referred to as the distance from the solidification front, where the solidification front is the point where the molten solder contact the bottom surface of the PCB. So the lower the delta T12, the greater the distance D from the solidification front.

There are a number of ways to reduce the value of delta T12. A first is to reduce the molten solder temperature T3. However, the molten solder temperature T3 can only be reduced so far without negatively impacting the percentage of barrel fill. A second is to increase the temperature generated by the bottom side preheaters. However, too high a preheat temperature damages the electronic components. Top side preheaters can be used, but preheating the top surface of the PCB using top side heaters has at least two drawbacks. First, the electronic components are heat sensitive and therefore the top side heaters can only provide a limited amount of heat. Second, since the through holes are positioned underneath the footprint of the electronic component, heat generated by the top side heaters is blocked by the body of the electronic component resulting in cold spots underneath the electronic component. This results in a lower temperature T1 at the top surface of the PCB at the through hole, which increases delta T12. The larger the size of the electronic component, the greater the size of the cold spot and the larger the delta T12 at the through hole. A third to reduce the value of delta T12 is to equalize heat throughout the through holes, in particular equalize the top side temperature T1 with the bottom side temperature T2. This third concept is the technique implemented using the thermal carrier.

Conventional methods of preheating the top side of the PCB leads to uneven heating, especially due to the cold spots formed underneath the electronic components. The thermal carrier is configured to direct heat generated by bottom side preheaters across the top surface of the PCB. It is key to note that the heat generated by and output from the preheaters, either bottom side or top side, is not being increased. Instead, the convection force (the force of convection heat transfer) applied to the top surface of the PCB is being adjusted by directing the heated air across the top surface of the PCB. So the heat output by the preheaters and therefore the amount of heat vertically applied to the top and bottom surfaces is kept the same, within tolerance of the electronic components, but the heat transfer is increased. Heat transfer is increased by forced heated air convection across the top surface of the PCB.

Bottom side preheaters cover an area that extends beyond the footprint of the PCB, such as that shown in FIG. 3. The bottom side of the PCB is preheated as before, but the thermal carrier is positioned above portions of the bottom side preheaters that extend laterally beyond the PCB footprint. The heated air generated by these laterally extending portions of the bottom side preheaters are directed by the thermal carrier laterally across the top surface of the PCB. In embodiments that include top side preheaters, the thermal carrier can also be configured to pull heated air from top side preheaters and direct the heated air laterally across the top surface of the PCB. Top side preheaters can be positioned directly above the PCB, but the heat generated and directed vertically onto the electronic components must be limited so as to avoid damaging the electronic components. Top side preheaters can also cover an area that extends beyond the footprint of the PCB, such as that shown in FIG. 4. Top side preheaters are positioned to the sides above the PCB, not above the footprint of the PCB. The heated air generated by these laterally extending portions of the top side preheaters are directed by the thermal carrier laterally across the top surface of the PCB.

Figure 4:
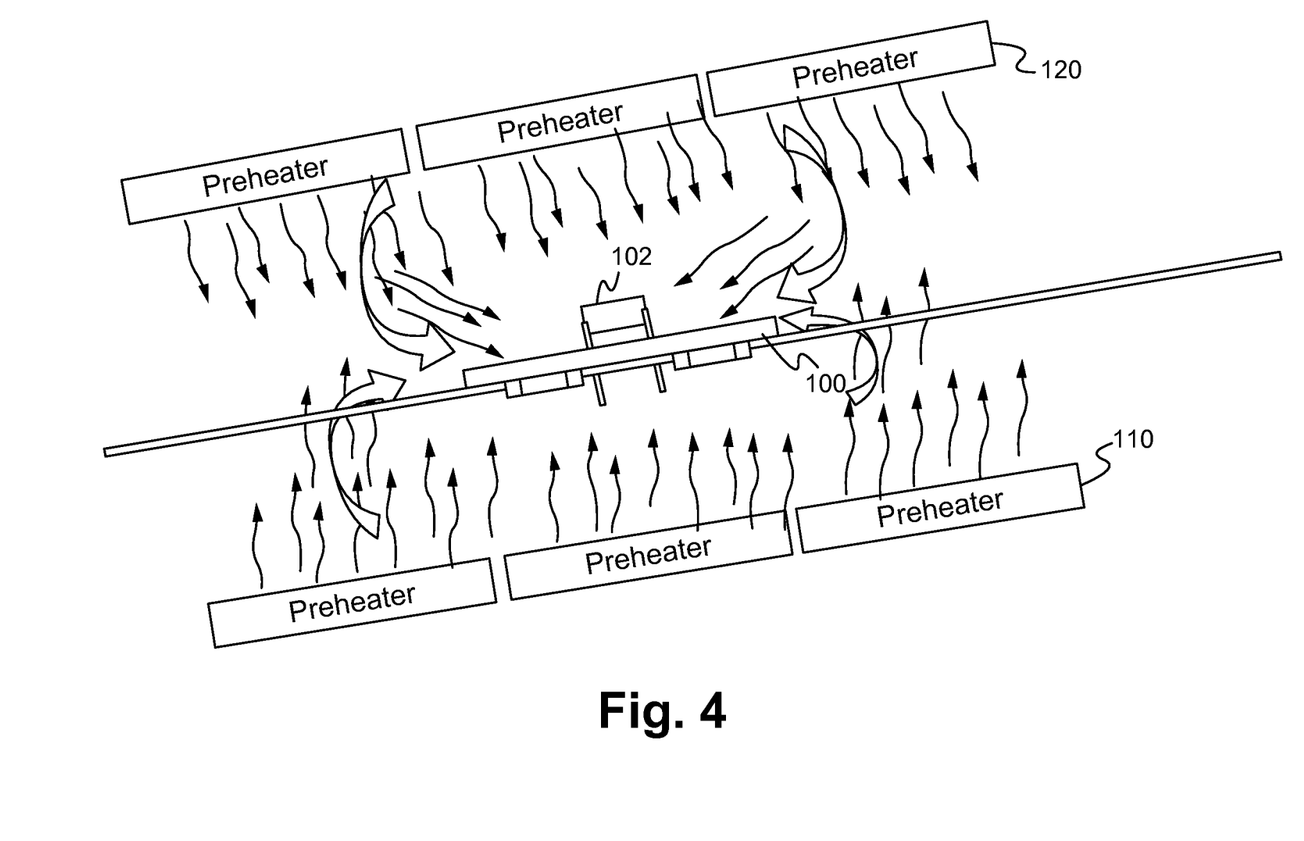
FIG. 4 illustrates another exemplary application of preheaters without a thermal carrier for applying heat to a PCB.
Figure 6:
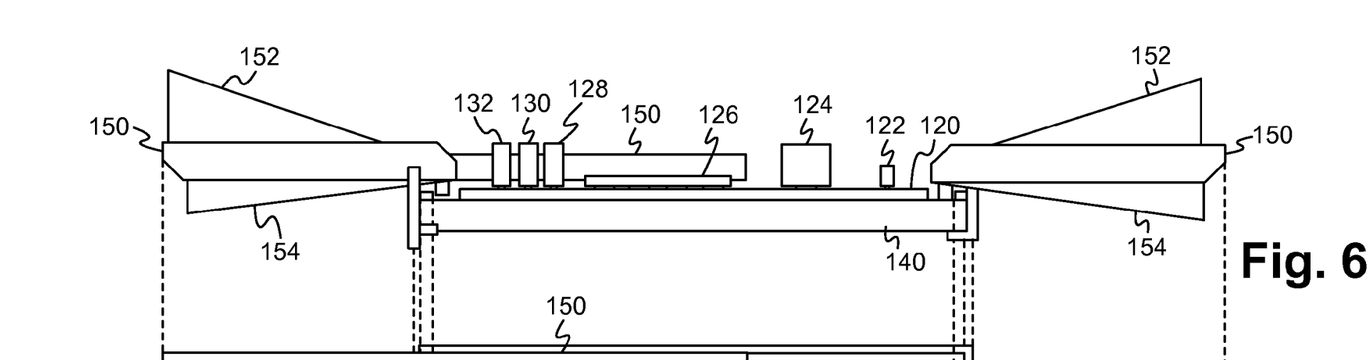
FIG. 6 illustrates a side view of a thermal carrier and PCBA according to an embodiment.
Figure 7:
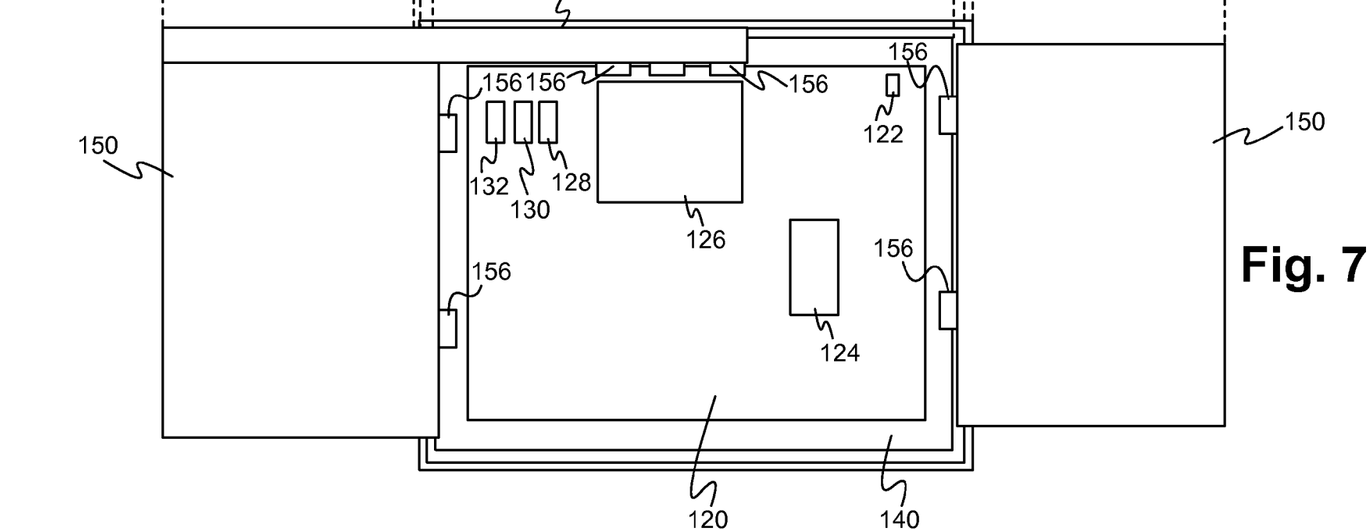
FIG. 7 illustrates a top down view of the thermal carrier and PCBA of FIG. 6.

FIG. 6 illustrates a side view of a thermal carrier and PCBA according to an embodiment. FIG. 7 illustrates a top down view of the thermal carrier and PCBA of FIG. 6. The PCBA includes a PCB 120 having surface mounted electronic components 122-132. The PCBA is mounted in a transport 140 for transporting the PCBA through various stages of the wave soldering process. The transport 140 leaves exposed the bottom surface of the PCB 120. The thermal carrier 150 is made of duct work that has downward facing input openings 154 to receive the heated air generated by the bottom side preheaters, such as the bottom side preheaters 110 shown in FIG. 3. The bottom side preheaters cover an area that extends beyond the footprint of the PCB 120, such as shown in FIG. 3. The thermal carrier 150 is positioned above portions of the bottom side preheaters that extend laterally beyond the PCB footprint. As such, heated air output from the laterally extended portions of the bottom side preheaters is input into the downward facing input openings 154 of the thermal carrier 150. The portion of the bottom side preheaters positioned below the footprint of the PCB 120 heats the bottom surface of the PCB 120 as normal. In some embodiments, the thermal carrier 150 also has upward facing input openings 152 to receive heated air generated by top side preheaters, such as the top side preheaters 120 shown in FIG. 4. The top side preheaters cover an area that extends beyond the footprint of the PCB 120, such as shown in FIG. 4. The thermal carrier 150 is positioned below portions of the top side preheaters that extend laterally beyond the PCB footprint. As such, heated air output from the laterally extended portions of the top side preheaters is input into the upward facing input openings 152 of the thermal carrier 150. The portion of the top side preheaters positioned above the footprint of the PCB 120 heats the top surface of the PCB 120 as normal.

The top side preheaters direct heated air straight down onto the top surface of the PCB 120. Since the electronic components 122-132 block the underneath portion of the PCB from being directly exposed to the top side preheaters, this results in the cold spots underneath the electronic components. Exemplary electronic components are shown as elements 122-132 in FIGS. 6 and 7. The duct work of the thermal carrier 150 also has laterally facing output openings for outputting the heated air laterally across the top surface of the PCB 120. In some embodiments, the thermal carrier 150 includes one or more motorized fans for drawing the heated air into the input openings 152, 154 and for forcing the heated air out the output openings.

In some embodiments, the laterally facing output openings of the thermal carrier 150 are configured to provide heated air uniformly across the top surface of the PCB 120. In other embodiments, the laterally facing output openings are configured to provide heated air selectively across the top surface of the PCB 120. For example, FIGS. 6 and 7 show an exemplary configuration where the output openings 156 are aligned with one or more of the electronic components 122-132 positioned on the top surface of the PCB 120, thereby directing more heated air across cold spots on the PCB 120 that correspond to the positions of the electronic components 122-132. The positions and number of the electronic components 122-132, and the positions and number of the laterally facing output openings 156 shown in FIGS. 6 and 7 is for exemplary purposes only. It is understood that the positions and number of the electronic components 122-132 and laterally facing output openings can be different than that shown in FIGS. 6 and 7. Further, although FIGS. 6 and 7 show duct work that is positioned on 3 sides of the PCBA, it is understood that duct work can be configured on any combination of sides to output heated air across the top surface of the PCB.

The duct work of the thermal carrier 150 is not positioned directly over the PCB 120 because top side heaters are positioned there to provide heated air to the overall top surface of the PCB. The top side heaters direct heated air straight down onto the top surface of the PCB. Since the electronic components block the underneath portions of the PCB from being exposed to the top side preheaters, this results in the cold spots underneath the electronic components. The laterally direct heated air output from the thermal carrier minimizes these cold spots. The heated air laterally directed across the top surface of the PCB increases the heat transfer across the top surface thereby increasing the top surface temperature T1 at the through hole without increasing the temperature of the mounted electronic component. Increasing the top surface temperature T1 at the through hole reduces the delta T12 which enables the solder to travel a greater distance D into the through hole.

The present application has been described in terms of specific embodiments incorporating details to facilitate the understanding of the principles of construction and operation of the thermal carrier. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A system for performing a preheating step of a wave soldering process, the system comprising:
   a. a printed circuit board assembly comprising a printed circuit board having a top surface and a bottom surface, one or more through holes and an electronic component having one or more pins, each pin positioned in a corresponding through hole;
   b. a bottom side preheater configured to direct heated air upward toward the bottom surface of the printed circuit board; and
   c. a thermal carrier comprising duct work having one or more downward facing input openings and one or more laterally facing output openings, wherein the thermal carrier is positioned adjacent to the printed circuit board assembly such that heated air from the bottom side preheater is input into the input openings and heated air is output from the output openings laterally across the top surface of the printed circuit board.

2. The system of claim 1 wherein the one or more output openings in the duct work are configured to uniformly distribute the heated air across the top surface of the printed circuit board.

3. The system of claim 1 wherein the one or more output openings in the duct work are aligned with the electronic component to selectively distribute the heated air across the top surface to the electronic component.

4. The system of claim 1 further comprising a top side preheater configured to output heated air downward toward the top surface of the printed circuit board.

5. The system of claim 4 wherein the duct work further comprises one or more upward facing input openings positioned to receive heated air from the top side preheater and to output the heated air from the output openings.

6. The system of claim 1 wherein the thermal carrier further comprises a motorized fan.

7. The system of claim 1 wherein the laterally output heated air increases a top surface temperature of the top surface underneath the electronic component, thereby decreasing a temperature differential between the top surface temperature and a bottom surface temperature.

* * * * *